United States Patent [19]

Aigo

[11] 4,409,471
[45] Oct. 11, 1983

[54] INFORMATION CARD

[76] Inventor: Seiichiro Aigo, 3-15-13 Negishi, Daito-ku, Tokyo, Japan

[21] Appl. No.: 331,512

[22] Filed: Dec. 17, 1981

[51] Int. Cl.³ .......................................... G06K 19/06
[52] U.S. Cl. .................................. 235/492; 235/487; 235/441; 357/84
[58] Field of Search ............... 235/492, 487, 441, 382, 235/380; 357/79, 84

[56] References Cited

U.S. PATENT DOCUMENTS

| | | | |
|---|---|---|---|
| 3,541,480 | 9/1968 | Tenenholtz | 333/98 |
| 3,941,928 | 3/1976 | Gaind | 178/7.8 |
| 4,107,555 | 8/1978 | Haas et al. | 307/308 |
| 4,361,756 | 11/1982 | Parmentier | 235/487 |

FOREIGN PATENT DOCUMENTS 55-153355 11/1980 Japan ..................... 357/84

Primary Examiner—C. Z. Rubinson
Assistant Examiner—Robert Lev
Attorney, Agent, or Firm—McGlew and Tuttle

[57] ABSTRACT

Each semiconductor chip included in an information card according to this invention is enclosed in a metallic casing and roofed by a cover film. A conductor strip, extending from each of contacts of the semiconductor chip, is attached to the metallic casing through an insulative material. An electrically conductive elastic member having a magnet at its free end is provided in the metallic casing at a location corresponding to the conductor strip. When the conductor strip is not in contact with its corresponding signal input/output terminal, it is maintained in contact with the elastic member so as to electrically connect itself with the metallic casing through the elastic member, whereby connecting all conductor strips together and protecting the semiconductor chip from electrostatic breakdown.

4 Claims, 8 Drawing Figures

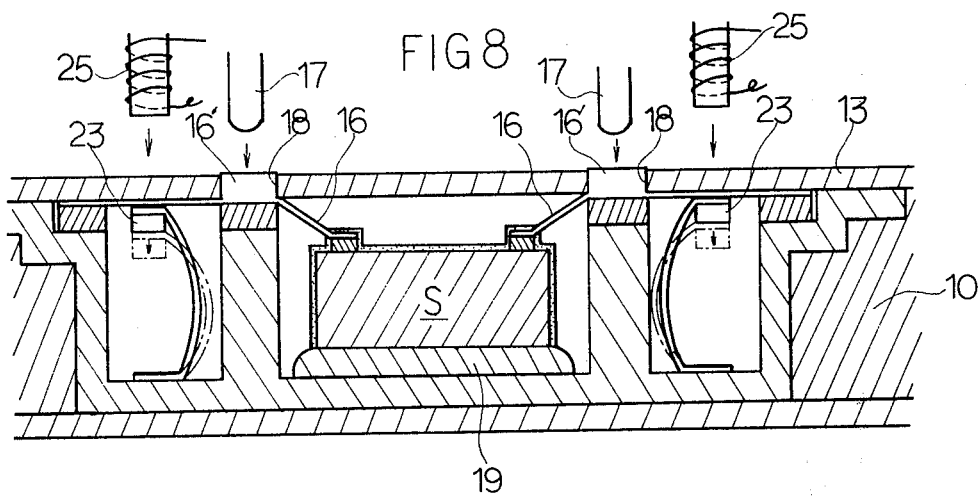

4,409,471

INFORMATION CARD

BACKGROUND OF THE INVENTION (a) Field of the Invention

This invention relates to an improvement in or relating to an information card such as cash card, which is adapted to identify an individual or organization in accordance with security code information such as a combination of numbers, letters and/or the like to be input from the exterior and to store an input signal or process the input signal by a semiconductor device built in the card and store the thus-processed information therein or to generate an output signal in response to the input signal.

(b) Description of the Prior Art

In recent years, microprocessors, non-volatile memories and the like devices have been applied to information cards of the above type. As semiconductor chips for such devices, MOS-type semiconductor chips are most common. However, a MOS-type semiconductor chip is accompanied by a drawback that it is very susceptible to electrostatic breakdown. Thus, such an information card has involved a problem that a semiconductor device or semiconductor devices built in the card are broken by, for example, rubbing the card with clothing, thereby rendering the card unsuitable for actual use.

SUMMARY OF THE INVENTION

This invention contemplates to solve the above problem of the prior art information cards. Accordingly, an object of this invention is to provide an information card whose built-in semiconductor chips are safely protected from electrostatic breakdown.

To achieve the above object of this invention, the characteristic features of an information card according to this invention resides in that each of the conductor strips extending from their corresponding contacts of each semiconductor chip contained in the card makes up an independent circuit with its corresponding signal input/output terminal when the conductor strip is brought into contact with the corresponding signal input/output terminal, but, when the conductor strips are not in contact with their respective signal input/output terminals, they are electrically connected with a metallic casing through their respective elastic members, whereby being mutually connected.

Thus, in one aspect of this invention, there is provided an information card adapted to identify an individual or organization in accordance with security code information, to store an input signal therein or to generate an output signal in response to the input signal and to provide like functions. The card includes a metallic casing disposed in an opening which is formed in the card and at least one semiconductor chip seated in the metallic casing and roofed by a cover film. A conductor strip extending from each of contacts of the semiconductor chip is disposed in such a way that it can be brought into contact with a signal input/output terminal. The information card further comprises an elastic member provided in said metallic casing at a location corresponding to the conductor strip and equipped with a magnet at the free end thereof. The conductor strip is fixedly secured to the metallic casing through an insulative material. When the conductor strip is spaced apart from the signal input/output terminal, the conductor strip is kept in contact with the magnet or elastic member so that it is electrically connected with the metallic casing through the elastic member, whereby electrically connecting all conductor strips together and protecting the semiconductor chip from electrostatic breakdown.

The above and other objects, features and advantages of the present invention will become apparent from the following description and the appended claims, taken in conjunction with the accompanying drawings.

BRIEF DESCRIPTION OF THE DRAWINGS

FIG. 8 is a cross-sectional view similar to FIG. 4 of an information card of another embodiment of the invention.

DETAILED DESCRIPTION OF THE INVENTION AND PREFERRED EMBODIMENTS

Figure 1:
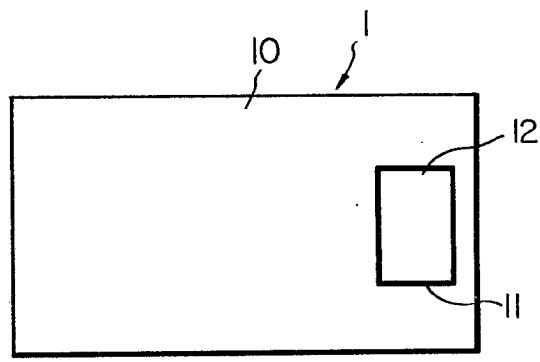
FIG. 1 is a plan view of a general information card to which the present invention relates.
Figure 2:
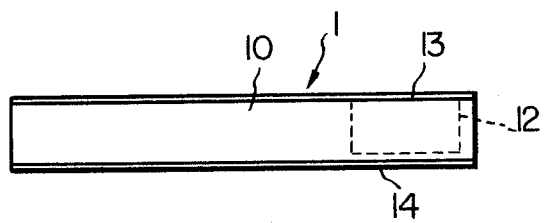
FIG. 2 is a side view of the information card.

Referring now to the accompanying drawings, certain preferred embodiments of the present invention will be described. FIGS. 1 and 2 illustrate an example of information cards to which the present invention relates. An information card 1 is constituted by a card base 10, a metallic casing 12 disposed or embedded in an opening 11 which is formed at a suitable location in the card base 10, one or more semiconductor chips enclosed in the metallic casing 12, and other members related thereto. The card base 10 is made of a plastic material or the like, similar to conventional information cards, and the metallic casing 12 is made of an electrically conductive material such as a copper plate or the like. However, the concept of the casing 12 includes a casing comprising a metallic bottom plate and surrounding walls made of non-metallic material such as ceramics or plastics, because such a casing has the same function as a wholly metallic one. In the illustrated example, the opening 11 and metallic casing 12 are formed both into rectangular shapes in plan. Needless to say, they may however be formed into circular or any other suitable shapes.

Figure 3:
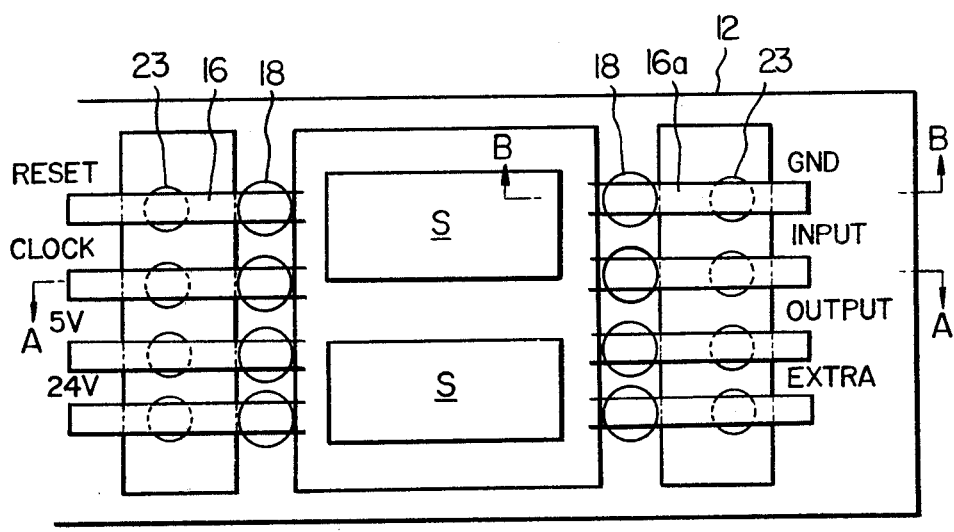
FIG. 3 is a fragmentary plan view of an information card according to one embodiment of this invention.
Figure 4:
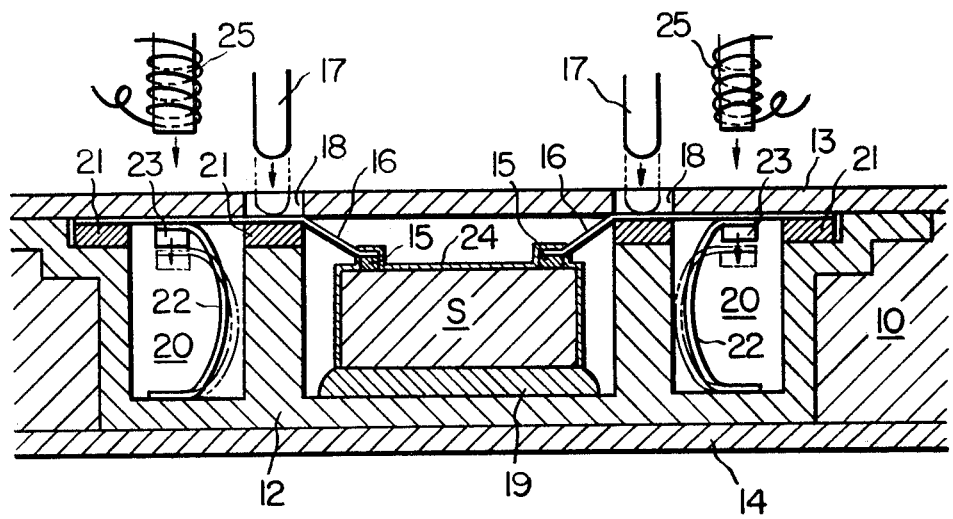
FIG. 4 is a cross-sectional view taken along line A—A of FIG. 3.
Figure 5:
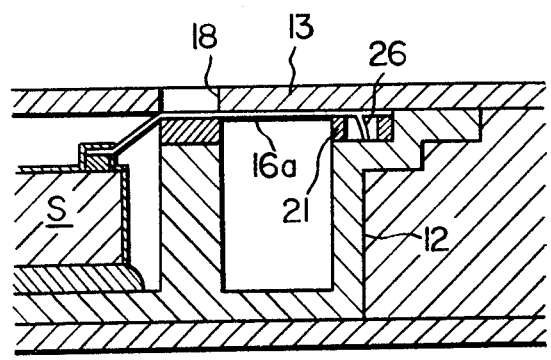
FIG. 5 is a cross-sectional view taken along line B—B of FIG. 3.

FIGS. 3 through 5 depict an embodiment of this invention. In this embodiment, two semiconductor chips S are disposed in the metallic casing 12, one of which is used as a microprocessor to make a verification of the card holder and also to protect the data and program, which are used for the processing of transactions, from any unauthorized alteration, and the other of which is employed as a memory. As shown in FIG. 4, the front face of the card base 10 is covered with a cover film 13 while its back face is also covered by a similar cover film 14. In this illustrated embodiment, conductor strips 16 extending from their corresponding eight pieces of contacts 15 of the semiconductor chips S are designed to be brought into contact with their corresponding signal input/output terminals 17, which are provided separately from the information card 1. Thus, the front cover film 13 defines, at locations corresponding to the conductor strips 16, apertures 18 so that the signal input/output terminals 17 can contact to the conductor strips. The terminals will contact the strips therethrough or, as well known, will contact a part 16' integrally formed on the conductor strips, the part filled in the aperture 18. FIG. 8 depicts a form provided with part 16' of the strips filled in the aperture 18.

As illustrated in FIG. 4, the interior of the metallic casing 12 is suitably partitioned. The semiconductor chips S are arranged in the middle section of the interior. The chips S are fixedly secured on the bottom wall of the metallic casing 12 through their respective electrically-conductive pastes 19. The conductor stip 16 from each contact 15 is made of a thin strip-like material such as for example a copper foil and extends astride its corresponding cavity 20 formed in the metallic casing 12 aside the semiconductor chips S. The conductor strip 16 is fixedly secured to a given location of the metallic casing 12 through an insulative material 21. Also as shown in FIG. 4, an elastic member 22 is provided in the cavity 20 at a location corresponding to each of the conductor strips 16. In the illustrated embodiment, leaf springs are provided. One end of each leaf spring 22 is fixed to the bottom wall of the metallic casing 12, while the other end, i.e., the free end thereof is provided with a magnet 23. These leaf springs 22 are made of a suitable electrically-conductive material. They are kept in an elongated state, as shown in FIG. 4, when the signal input/output terminals 17 provided with a measurement head(not illustrated) are not in contact with, in other words, are apart from their corresponding conductor strips 16. Thus, all the leaf springs 22 are kept in contact with their corresponding conductor strips 16. Accordingly, all the conductor strips 16 are electrically connected with the metallic casing 12 through their respective leaf springs 22, thereby mutually connecting all the conductor strips 16 through the metallic casing 12. By the way, numeral 24 in FIG. 4 indicates a passivation glass film enclosing each of the semiconductor chips S.

When the information card 1 is placed at a prescribed position to activate same, the measurement head comes down to cause its signal input/output terminals 17 at locations of their corresponding apertures 18 formed through the cover film 13, to contact with their corresponding conductor strips 16. At the same time, electromagnets 25 provided with the measurement head are magnetized, thereby applying a repulsive force to the magnet 23 provided at the tip of each leaf spring 22 by virtue of a repulsion action caused by the magnetic force of its relevant electromagnet. As a result, the free end of each of the leaf springs 22 is displaced downwardly as shown by phantom lines in FIG. 4 and thus separated from its corresponding conductor stip 16. This renders the conductor strips 16 isolated from one another, thereby establishing an independent circuit for each of the conductor strips 16.

In addition, a specific conductor strip, for example, a conductor strip 16a at a position designated by "GND" in FIG. 3 is always grounded. Therefore, as shown in FIG. 5, there is no elastic member 22 provided at a location corresponding to the above specific conductor strip 16a. The conductor strip 16a is connected to the metallic casing 12 by a conductor 26 which extends through at least one of the layers 21 of an insulative material. Thus, the conductor strip 16a is grounded through the metallic casing 12. In FIG. 3, "CLOCK" indicates a conductor strip for signals to control the activation of the semiconductor device, "5V" a conductor strip for a power supply of the semiconductor device, "24V" a conductor strip for a power supply for writing-in, reading-out, erasure, etc. of information stored, and "EXTRA" a space terminal.

Figure 6:
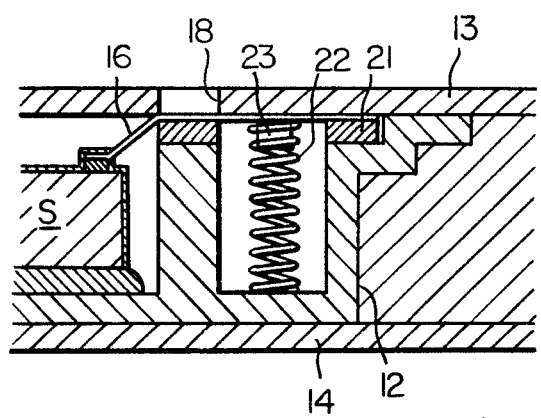
FIG. 6 is a fragmentary cross-sectional view showing an information card according to another embodiment of this invention.
Figure 7:
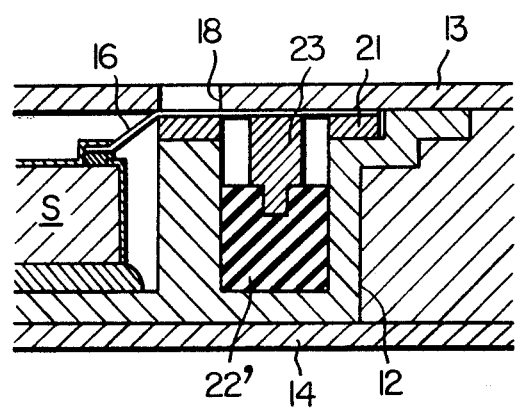
FIG. 7 is a fragmentary cross-sectional view of an information card according to a further embodiment of this invention.

In the above embodiment, leaf springs are used as elastic members. Although use of such leaf springs are generally preferred and the elastic members are supposed to be electrically conductive, they are not necessarily leaf springs. As shown in FIG. 6, coil springs may function in the same manner as the leaf springs. Furthermore, as illustrated in FIG. 7, electrically conductive rubber 22' may also be used as an elastic member. In this case, one end portion of an electrically conductive magnet 23 is embedded in the rubber 22' and the other end portion of the magnet 23 is allowed to contact with the conductor strip 16. When activating the information card 1, the rubber 22' is compressed by the repulsive force of the magnet, thereby separating the magnet 23 from the conductor strip 16. In some instances, parmanent magnets may be used in lieu of the electromagnets 25.

Accordingly, the measurement head for activating an information card according to this invention is provided with a suitable number of magnets 25, whereby rendering each conductor strip 16 to form an independent circuit during the activation of the information card. However, prior to an activation, the conductor strips of the information card are electrically connected with the metallic casing by means of their corresponding elastic members or elastic members and magnets disposed in the metallic casing, thereby mutually connecting all the conductor strips and allowing them to have the same potential. Accordingly, the semiconductor chips will not be affected by electrostatic energy and can thus be protected from electrostatic breakdown even if they are subjected to such electrostatic energy due to rubbing of the information card or the like.

Therefore, it will be possible to provide information cards of extremely high utility when the present invention is applied to information cards containing one or more semiconductor chips of the MOS-type structure.

Having now fully described the invention, it will be apparent to one of ordinary skill in the art that many changes and modifications can be made thereto without departing from the spirit or scope of the invention as set forth herein.

What is claimed is:

1. In an information card adapted to identify an individual or organization in accordance with security code information, to store an input signal therein or to generate an output signal in response to the input signal and to provide like functions, said card including a metallic casing disposed in an opening which is formed in said card and at least one semiconductor chip seated in said metallic casing and roofed by a cover film, and a conductor strip extending from each of contacts of said semiconductor chip being disposed in such a way that it can be brought into contact with a signal input/output terminal, the improvement comprises that said information card further comprises an elastic member provided in said metallic casing at a location corresponding to the conductor strip and equipped with a magnet at the free end thereof, the conductor strip is fixedly secured to the metallic casing through an insulative material, and, when the conductor strip is spaced apart from the signal input/output terminal, the conductor strip is kept in contact with said magnet or elastic member so that it is electrically connected with said metallic casing through said elastic member, whereby electrically connecting all conductor strips together and protecting said semiconductor chip from electrostatic breakdown.

2. The information card as claimed in claim 1, wherein said elastic member is a leaf spring.

3. The information card as claimed in claim 1, wherein said elastic member is a coil spring.

4. The information card as claimed in claim 1, wherein said elastic member is an electrically conductive rubber, which is electrically connected with the conductor strip through said magnet.

* * * * *